United States Patent
Perner

(10) Patent No.: US 6,590,816 B2
(45) Date of Patent: Jul. 8, 2003

(54) INTEGRATED MEMORY AND METHOD FOR TESTING AND REPAIRING THE INTEGRATED MEMORY

(75) Inventor: Martin Perner, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/091,076

(22) Filed: Mar. 5, 2002

(65) Prior Publication Data

US 2002/0122341 A1 Sep. 5, 2002

(30) Foreign Application Priority Data

Mar. 5, 2001 (DE) .......................................... 101 10 469

(51) Int. Cl.[7] ............................................ G11C 29/00
(52) U.S. Cl. ....................................... 365/200; 365/201
(58) Field of Search .................................. 365/200, 201

(56) References Cited

U.S. PATENT DOCUMENTS

| | | | |
|---|---|---|---|
| 4,939,694 A | | 7/1990 | Eaton et al. ................. 365/200 |
| 6,011,734 A | * | 1/2000 | Pappert ....................... 365/200 |
| 6,067,262 A | * | 5/2000 | Irrinki et al. ................. 365/200 |
| 6,178,124 B1 | | 1/2001 | Kaiser et al. ................. 365/200 |
| 6,259,637 B1 | * | 7/2001 | Wood et al. ................. 365/200 |
| 6,324,106 B2 | * | 11/2001 | Urakawa ..................... 365/200 |

OTHER PUBLICATIONS

Infineon Technologies AG Datasheet: "SDRAM Module", pp. 1, 5 and 17.
Infineon Technologies AG Datasheet: "64 Mbit Synchronous DRAM", pp. 30, 29, 7, 8, 1, 6, 3 and 20.

* cited by examiner

Primary Examiner—Trong Phan
(74) Attorney, Agent, or Firm—Laurence A. Greenberg; Werner H. Stemer; Ralph E. Locher

(57) ABSTRACT

The integrated memory has memory cells in a memory cell block having a plurality of column lines and a plurality of row lines. The row lines include regular row lines and redundant row lines. In the event of a read access to a current row line, a self-test unit checks the correctness of the memory cell contents read and, in the event of a defect, generates a defect signal for the current row line and, for each regular row line, detects the defects ascertained and compares them with an average defect for all of the regular row lines. When a predetermined repair condition is met during the comparison, the self-test unit outputs a row repair signal for the current row line. A self-repair unit interacting with the self-test unit replaces the current row line by a redundant row line in response to a row repair signal in the course of operation of the integrated memory. By still utilizing the existing redundancy after delivery, the failure probability of the memory module can be significantly reduced.

17 Claims, 6 Drawing Sheets

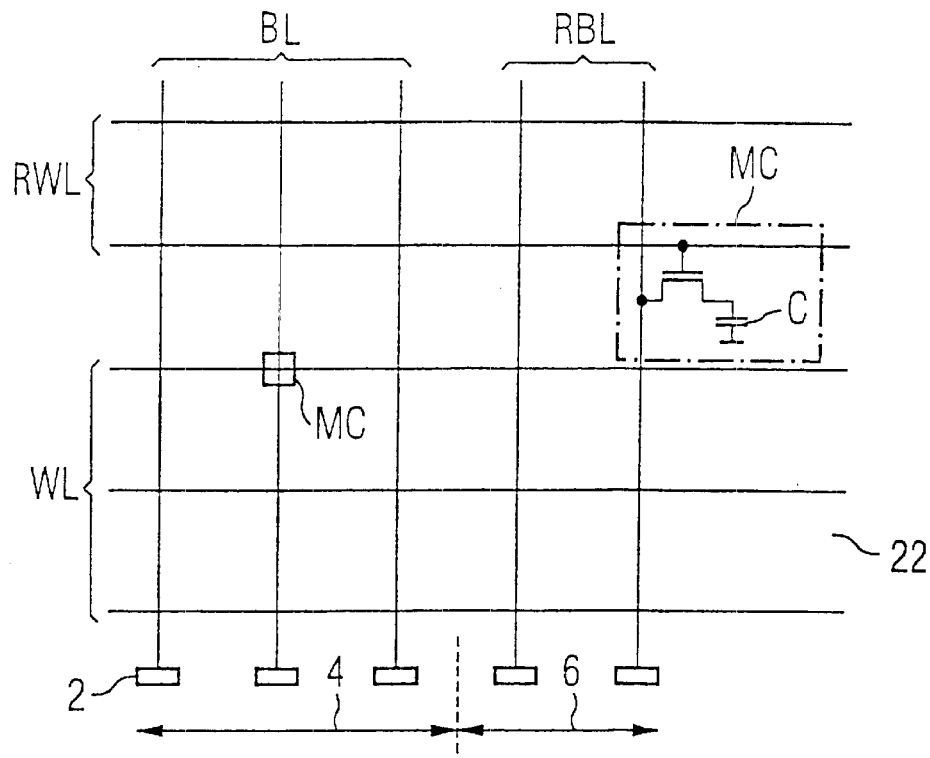
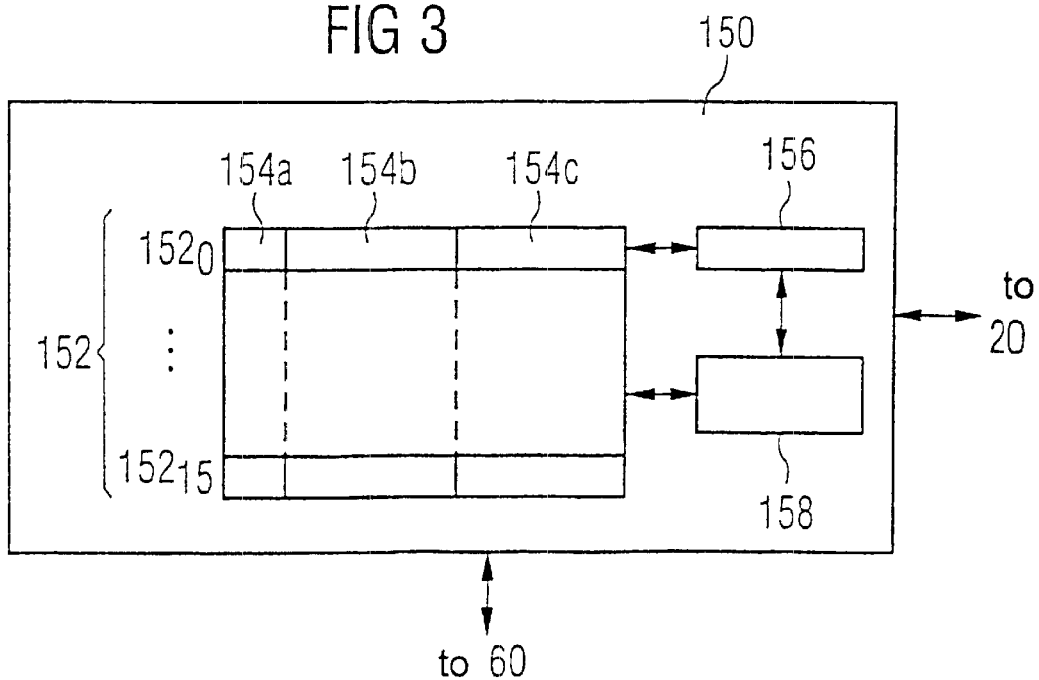

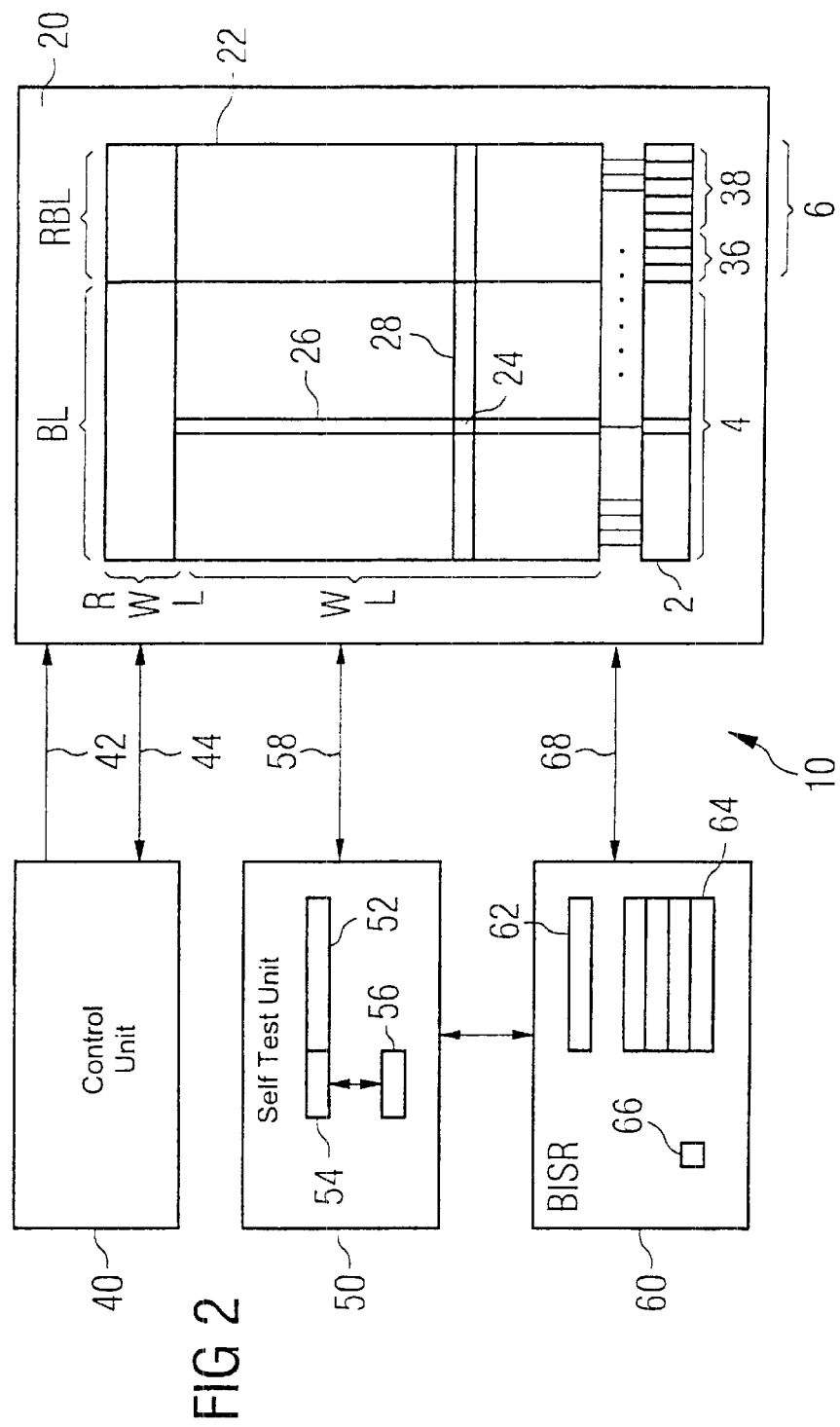

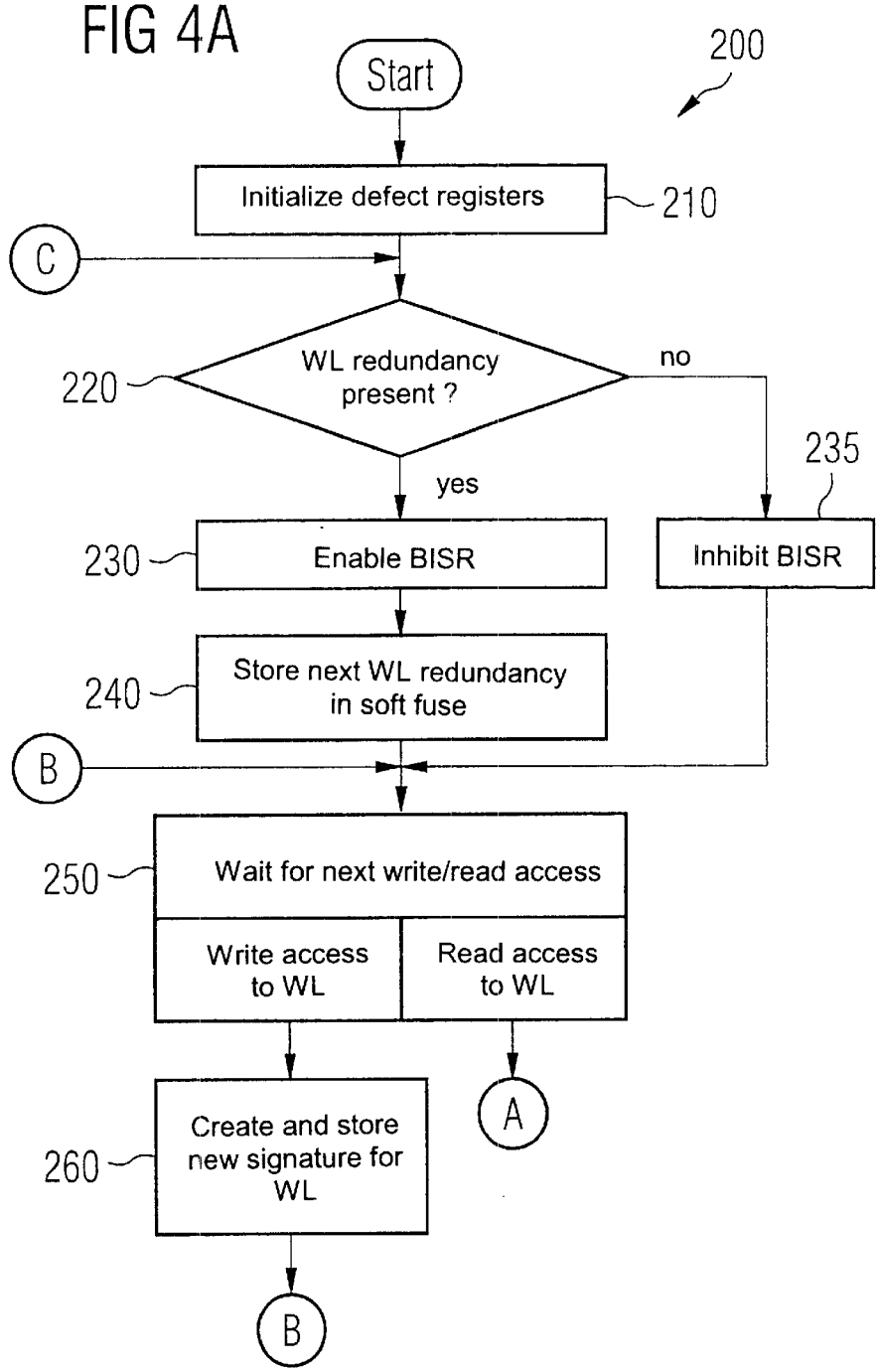

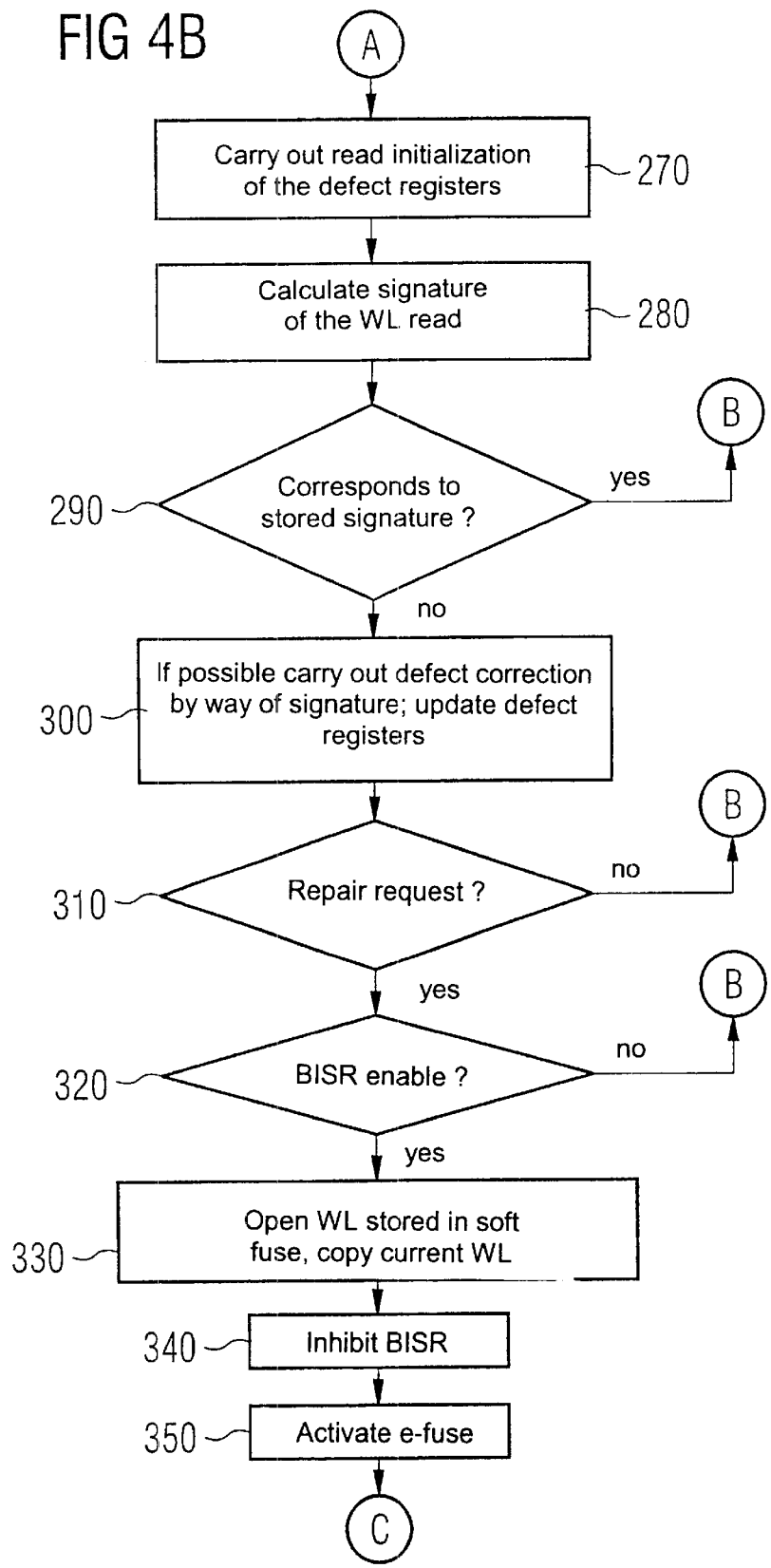

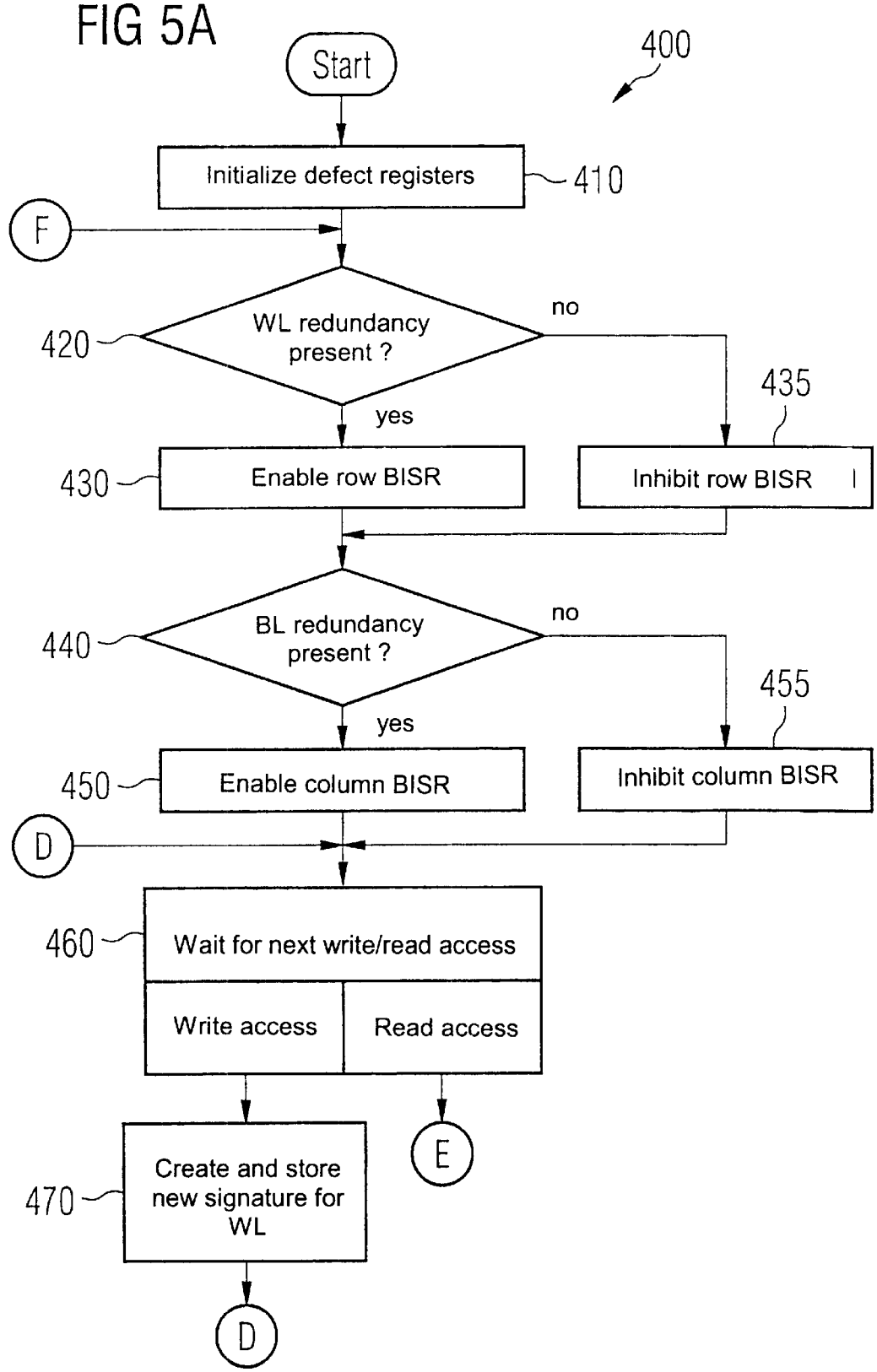

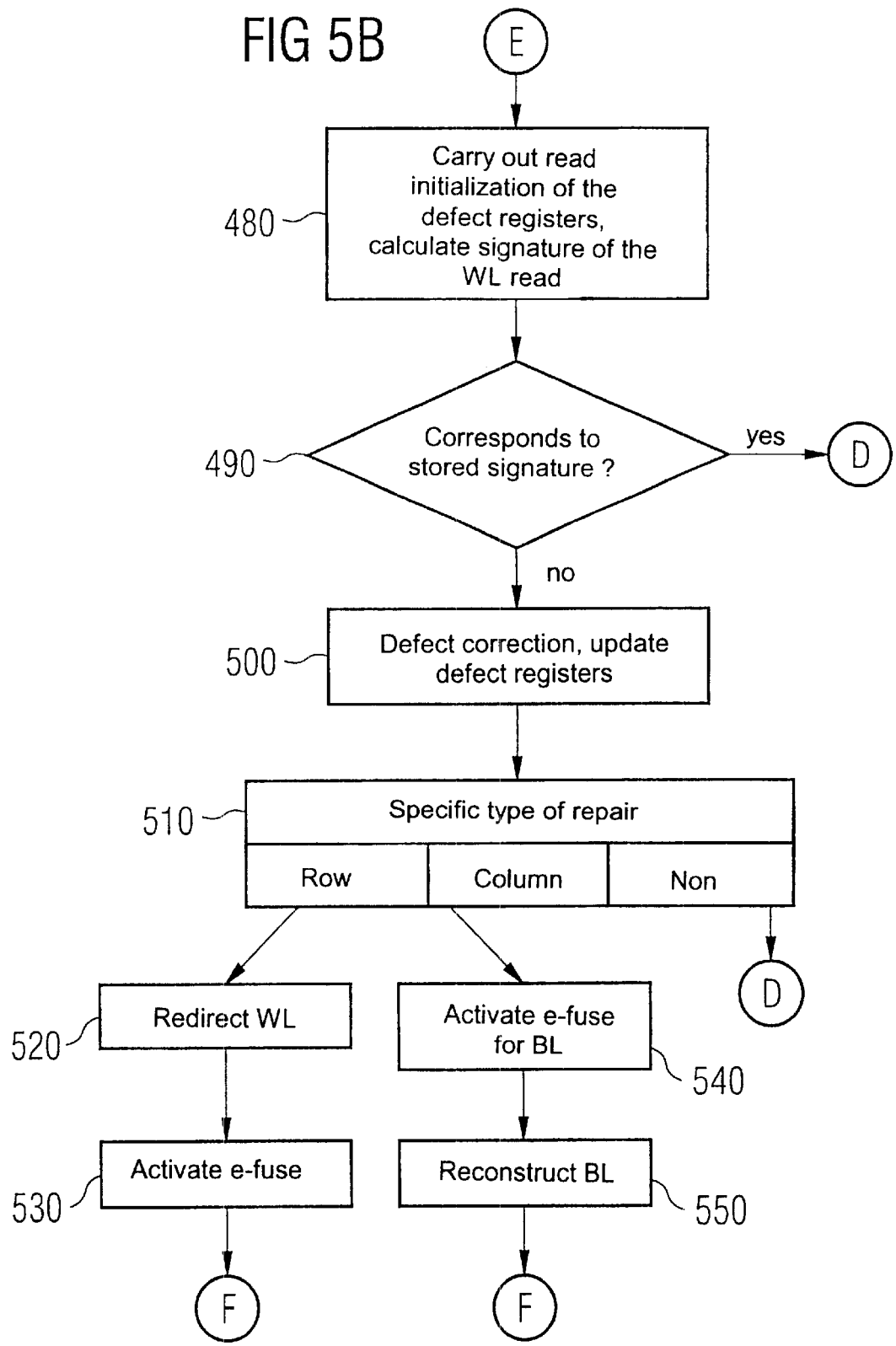

INTEGRATED MEMORY AND METHOD FOR TESTING AND REPAIRING THE INTEGRATED MEMORY

BACKGROUND OF THE INVENTION

Field of the Invention

The present invention lies in the integrated technology field. More specifically, the invention relates to an integrated memory having memory cells arranged in a memory cell block having a plurality of column lines and a plurality of row lines. The invention furthermore relates to a method for testing and repairing an integrated memory of that type.

Manufacturers generally test integrated semiconductor memories for functionality and repair them as far as possible before delivery of the memories. To that end, the semiconductor memories have not only regular memory cells but also redundant memory cells which can replace a certain proportion of the regular memory cells in the case of defects that have been ascertained. In this context, the redundant memory cells are generally combined in the same way as the regular memory cells to form row lines (word line, WL) and column lines (bit line, BL).

A redundancy concept of this type makes it possible to increase the chip yield during production. After chip fabrication, memory defects are determined by targeted testing and recorded in a defect log. Programmable elements, for example a series of so-called laser fuses, are then used to exchange, in address terms, individual defective row lines or column lines for defect-free redundant row or column lines, respectively.

If laser fuses are used as the programmable elements, then defective row or column lines can only be replaced during the tests at the wafer level. The laser fuses are no longer accessible to the programming laser beam once the chip has been incorporated into a housing.

If electrically programmable fuses, so-called e-fuses, are used as programmable elements, redundancy activation is possible even after the chips have been incorporated into a housing. This is utilized primarily when module defects are not discovered until late in the production or test sequence.

After delivery of the modules, defect correction through the exchange of redundant elements no longer takes place. Defects that occur at this stage lead at worst to the failure of the module and to a return to the manufacturer. In order to preclude this risk, the devices are usually subjected to so-called stress tests, the aim of which is to get as far as possible all susceptible devices to fail whilst still in the test phase with the manufacturer, so that the purchaser only acquires already repaired modules with a low failure probability for the future. However, such stress tests are time-consuming and costly. Moreover, they cannot reduce the failure rate of regular modules after delivery.

This forms the starting point for the invention.

SUMMARY OF THE INVENTION

It is an object of the invention to provide a integrated memory device and a method of testing and repairing the same, which overcome the above-mentioned disadvantages of the heretofore-known devices and methods of this general type and which provides for an integrated memory with a low failure probability after delivery.

With the foregoing and other objects in view there is provided, in accordance with the invention, an integrated memory, comprising:

a plurality of memory cells arranged in a memory cell block having a plurality of column lines and a plurality of row lines;

the plurality of row lines including regular row lines and redundant row lines;

a self-test unit connected to the memory cell block, the self-test unit:

upon a read access to a current row line, checking for a correctness of a memory cell content read in the read access and, upon detecting a defect, generating a defect signal for the current row line;

for each regular row line, detecting defects thus ascertained and performing a comparison comparing the defects with an average defect for all the regular row lines; and outputting a row repair signal for the current row line when a predetermined repair condition is met in the comparison;

a self-repair unit connected to the self-test unit, the self-repair unit, in response to receiving the row repair signal, replacing the current row line by a redundant row line during an operation of the integrated memory.

In accordance with an added feature of the invention, the plurality of column lines includes regular column lines and redundant column lines;

the self-test unit:

upon a read access to a current row line, checks the correctness of the memory cell contents read and, in an event of a defect, generates a defect signal for the current row line;

in case of an ascertained defect, compares a calculated signature of the memory cell contents with a previously stored signature, for determining the column line in which the defect occurred;

for each regular row line and for each regular column line, detects the defects ascertained and in each case performs a comparison comparing the defects with an average defect for all of the regular row lines and all of the regular column lines; and when a predetermined repair condition is met during the comparison, outputs a row repair signal for the current row line or a column repair signal for a column line that has been identified as defective; and the self-repair unit:

in response to a row repair signal, replaces the current row line by a redundant row line during the operation of the integrated memory; and in response to a column repair signal, replaces the column line that has been identified as defective by a redundant column line.

In an alternative embodiment of the invention, there is provided an integrated memory, comprising:

memory cells arranged in a memory cell block having a plurality of column lines and a plurality of row lines;

the plurality of row lines including regular row lines and redundant row lines, and the plurality of column lines including regular column lines and redundant column lines;

a self-test unit connected to the memory cell block and configured to:

in an event of a read access to a current row line, check a correctness of the memory cell contents read and, upon detecting a defect, generate a defect signal for the current row line;

in case of an ascertained defect, compare a calculated signature of the memory cell contents with a previously stored signature, for determining a respective column line in which the defect occurred;

store the complete addresses of the memory cells in which a defect occurred successively in a shift register;

if an address of a same memory cell is repeatedly stored in the shift register, determine the row line and column line associated with the memory cell; and when a predetermined repair condition is met, output a row repair signal for the associated row line or a column repair signal for the associated column line;

a self-repair unit connected to the self-test unit and configured to:

in response to a row repair signal, replace the current row line by a redundant row line during an operation of the integrated memory; and in response to a column repair signal, replace the column line that has been identified as defective by a redundant column line.

With the above and other objects in view there is also provided, in accordance with the invention, a method of testing and repairing an integrated memory having memory cells arranged in a memory cell block with a plurality of column lines and a plurality of row lines, and wherein the plurality of row lines includes regular row lines and redundant row lines, the method which comprises the following steps:

reading memory cell contents of a current row line;

checking a correctness of the memory cell contents read;

generating a defect signal for the current row line in a defect case;

detecting the defects ascertained for each regular row line;

comparing a number of defects of the current row line with an average defect for all the regular row lines;

outputting a row repair signal for the current row line when a predetermined repair condition is met in the comparing step; and replacing the current row line by a redundant row line in response to a row repair signal during an operation of the integrated memory.

In a further alternative of the invention—applicable when the plurality of row lines includes regular row lines and redundant row lines and the plurality of column lines includes regular column lines and redundant column lines— the method comprises the following steps:

reading memory cell contents of a current row line;

checking a correctness of the memory cell contents read;

in a defect case, comparing a calculated signature of the memory cell contents with a previously stored signature for determining the column line in which the defect occurred;

in a defect case, generating a defect signal for the current row line and a column line determined as defective;

detecting the defects ascertained for each regular row line and each regular column line;

comparing a number of defects of the current row line with an average defect for the regular row lines, and comparing a number of defects of a column line determined as defective with an average defect for the regular column lines;

outputting a row repair signal for the current row line or a column repair signal for a column line identified as defective when a predetermined repair condition is met during the comparing steps; and replacing the current row line by a redundant row line in response to a row repair signal during an operation of the integrated memory, or replacing the column line identified as defective by a redundant column line in response to a column repair signal.

Finally, there is provided a further method of testing and repairing an integrated memory having memory cells arranged in a memory cell block with a plurality of column lines and a plurality of row lines, the plurality of row lines including regular row lines and redundant row lines and the plurality of column lines including regular column lines and redundant column lines. The method comprises the following steps:

reading memory cell contents of a current row line;

checking a correctness of the memory cell contents;

in a defect case, comparing a calculated signature of the memory cell contents with a previously stored signature for determining the column line in which the defect occurred;

in the defect case, generating a defect signal for the current row line and a column line determined as defective;

storing the complete addresses of the memory cells in which a defect occurred;

testing for repeated storage of the address of the same memory cell;

upon reaching a predetermined number or frequency, determining the row line and column line associated with the memory cell;

outputting a row repair signal for the associated row line or a column repair signal for the associated column line when a predetermined repair condition is met; and replacing the current row line by a redundant row line in response to a row repair signal during an operation of the integrated memory, or replacing the column line identified as defective by a redundant column line in response to a column repair signal.

In further summary: The integrated memory according to the invention comprises memory cells arranged in a memory cell block having a plurality of column lines and a plurality of row lines, the plurality of row lines having regular row lines and redundant row lines.

It furthermore comprises a self-test unit, which, in the event of a read access to a present row line, checks the correctness of the memory cell contents read and, in the event of a defect, generates a defect signal for the present row line, which, for each regular row line, detects the defects ascertained and compares them with an average defect for all of the regular row lines, and which outputs a row repair signal for the present row line when a predetermined repair condition is met during the comparison.

The integrated memory furthermore comprises a self-repair unit interacting with the self-test unit, which self-repair unit, in response to a row repair signal, replaces the present row line by a redundant row line in the course of operation of the integrated memory.

Consequently, the invention is based on the concept of using the redundant memory cells that have remained after the functional tests and the defect correction effected by the manufacturer for defect correction in the course of operation of the module. For this purpose, an interacting self-test unit and a self-repair unit (built-in self-repair, BISR) are provided.

In order to decide whether a row line is defective and must be exchanged, the self-test unit logs the number of defects that have occurred for each of the row lines and also an average defect for all of the row lines. If a row line becomes conspicuous, for example through a significantly increased number of defects compared with the average, a repair signal is generated for this row line. The self-repair unit thereupon exchanges the defective row line for a redundant row line in the course of operation.

This measure enables the redundancy of memory cells that is present on the module to be utilized even after delivery to the customer and the failure probability of the memory module thus to be significantly reduced. On the other hand, it is also possible to reduce the test stringency during the manufacturer's tests and thereby to save time and costs, since it is no longer necessary for all the defects to be corrected as early as at this stage.

Preferably, the self-repair unit has a rewritable memory for rapidly redirecting the address of the present row line to the address of the redundant row line, and an irreversibly programmable memory for the permanent replacement of the present row line by the redundant row line.

This refinement takes account of the observation that the secure and permanent programming of an irreversibly programmable memory, in particular an e-fuse, requires some time, typically one to one thousand microseconds. In order to be able to maintain normal operation of the memory module during this time, the address of the row line to be repaired is temporarily redirected by means of a rewritable memory until the activation of the irreversibly programmable memory is concluded.

In accordance with a preferred refinement, the self-test unit checks the correctness of the read memory cell contents of the present row line using a comparison of a calculated signature of the memory cell contents with a stored signature of the memory cell contents. It is expedient for a signature of the memory cell contents to be calculated and stored for each write access of a row line. If the row line still has redundant bits available, this signature can be stored in a part of these bits.

In this context, what is taken into consideration as a signature is, for instance, the calculation of a check bit, calculation of a checksum or else the use of more complex test polynomials using ECC (error correction code). Simple signatures merely allow identification of the fact that a defect has occurred, while more complex signatures enable the determination of the defect position and in part also a correction of the defect that has occurred. All these methods, known per se, for calculating a signature from the memory contents are taken into consideration in the context of the present invention.

In accordance with an additional feature of the invention, the plurality of column lines has regular column lines and redundant column lines, in which a self-test unit, in the event of a read access to a present row line, checks the correctness of the memory cell contents read and, in the event of a defect, generates a defect signal for the present row line, in the case of an ascertained defect, compares a calculated signature of the memory cell contents with a previously stored signature, for the purpose of determining the column line in which the defect occurred, for each regular row line and for each regular column line, detects the defects ascertained and in each case compares them with an average defect for all of the regular row lines and all of the regular column lines, and when a predetermined repair condition is met during the comparison, outputs a row repair signal for the present row line or a column repair signal for a column line that has been identified as defective.

The self-repair unit of the integrated memory in response to a row repair signal, replaces the present row line by a redundant row line in the course of operation and in response to a column repair signal, replaces the column line that has been identified as defective by a redundant column line. This integrated memory enables not only the above-described repair of row lines but also the repair of defective column lines.

Preferably, the self-repair unit has an irreversible programmable memory for the permanent replacement of the column line that has been identified as defective by the redundant column line, and means for re-establishing the memory cell contents stored in the defective column line. In this case, the re-establishment means can access all of the row lines in order, re-establish the content of the memory cell of the defective column line using an error detection code and store it in the corresponding memory cell of the new, redundant column line.

In accordance with a concomitant feature of the invention, provided as an alternative or in addition to the previously described self-test unit, it is possible to provide a further self-test unit which, in the event of a read access to a present row line checks the correctness of the memory cell contents read and, in the event of a defect, generates a defect signal for the present row line, which, in the case of an ascertained defect, compares a calculated signature of the memory cell contents with a previously stored signature, for the purpose of determining the column line in which the defect occurred, which stores the complete addresses of the memory cells in which a defect occurred successively in a shift register, which, in the case of the address of the same memory cell being repeatedly stored in the shift register, determines the row line and column line associated with the memory cell, and which, when a predetermined repair condition is met, outputs a row repair signal for the associated row line or a column repair signal for the associated column line.

This self-test unit takes account of the fact that many memory cells do not produce a defect in the event of every access (hard defect), but rather fail only occasionally. In order that these memory cells can also be ascertained and replaced, the complete address of a memory cell in which a defect occurred is stored in a shift register. If the same address is stored there repeatedly, the associated memory cell is identified as defective and either the associated row line or the associated column line is replaced by a defect-free redundant line.

Further advantageous refinements, features and details of the inventions emerge from the dependent claims, the following description of the exemplary embodiments, and from the drawing.

Although the invention is illustrated and described herein as embodied in an integrated memory and a method for testing and repairing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic illustration of a matrix-type memory cell array;

FIG. 2 is a schematic illustration of an exemplary embodiment of an integrated memory according to the invention;

FIG. 3 is a diagram of a self-test unit of a different embodiment of the memory according to the invention;

FIGS. 4A and 4B show a flow diagram of a method according to the invention for testing and repairing an integrated memory; and FIGS. 5A and 5B show a flow diagram of a further method according to the invention for testing and repairing an integrated memory.

DESCRIPTION OF THE PREFERRED EMBODIMENTS

Referring now to the figures of the drawing in detail and first, particularly, to FIG. 1 thereof, there is shown a memory cell array 22 organized in a matrix, for example of a DRAM, which has regular row lines WL and regular column lines BL and also redundant row lines (RWL) and redundant column lines(RBL) which can replace regular row lines and column lines, respectively, in the defect case.

A respective memory cell MC is situated at each crossover point of a row line WL and a column line BL. The memory cell MC includes a selection transistor and a storage capacitor C. Upon the activation of a row line WL, the charge stored on the capacitor C in each case flows via the turned-on selection transistor to the associated column line BL, where it causes a voltage level change which is amplified by a sense amplifier 2 assigned to the column line BL. The entire information of the present word line is then buffer-stored in the sense amplifiers 2. In this case, both the contents of the regular memory cells 4 and those of the redundant memory cells 6 are available in the sense amplifier row.

FIG. 2 shows a block diagram of an embodiment of an integrated memory 10 according to the invention. The integrated memory 10 contains a memory block 20 containing an array of regular memory cells comprising 4096 regular row lines WL and 512 regular column lines BL. In addition, the memory block 20 comprises redundant memory cells which are combined in 128 redundant row lines RWL and eight redundant column lines RBL.

The memory block 20 is connected to a control unit 40, a self-test unit 50 and a self-repair unit (built-in self-repair, BISR) 60 which interacts with the self-test unit. The control unit 40 exchanges various signals with the memory block 20, applies addresses 42, for example, and writes or reads data 44 from the memory block 20.

In the event of a memory access to the memory block 20, an address 42 addresses exactly one row line 28 and exactly one column line 26, that is to say ultimately exactly one memory cell 24. The row line activation (RAS, row address strobe) activates the word line 28, as a result of which all 4096 coupled selection transistors, which together form a so-called page, are turned on, so that the information stored in the form of charge on the associated capacitors C is transferred to the respective column line. The resulting voltage level changes on the column lines are amplified and buffer-stored by the sense amplifiers 2 assigned to the column lines.

The subsequent column line activation command (CAS, column address strobe) then selects a single memory cell content from the buffer-stored memory cell contents 4. The sense amplifiers 6 assigned to the redundant column lines RBL are not utilized for regular memory operation. In the exemplary embodiment, three of the eight available bits are used to accommodate a signature 36 of the regular memory cell contents 4 for the purpose of defect correction. The five remaining bits 38 are utilized as a counter by storing the number of read defects that have previously occurred in association with the row line 28.

The self-test unit 50 contains a total row defect register 52 having a width of 16 bits and serving for accommodating the total number of defects which occur in the case of all read accesses to the row lines WL.

The upper four bits of the total row defect register 52 form a first row defect register 54, which, in the case of 4096 row lines ($4096=2^{12}$), contains precisely the average number of defects per row line. The second row defect register 56 likewise has a width of four bits and serves for buffer-storing the values of the first row defect register 54.

The self-repair unit 60 contains a soft fuse register 62 as rewritable memory, in which the address of the next free redundant row line is stored. A series of electrically programmable switches, so-called e-fuses, 64 serves for the permanent replacement of a defective row line by a redundant row line. The repair flag 66 in each case indicates whether a repair is possible at the present point in time. The self-test unit 50 and the self-repair unit 60 exchange data and control commands with the memory block 20 via connections 58, 68.

The mode of operation of the integrated memory and the method for testing and repairing the memory will now be explained in more detail with reference to the flow diagram of FIGS. 4A and 4B. The method 200 for testing and repairing defective rows of an integrated memory begins with step 210, the initialization of the defect registers. In this case, the total row defect register 52 and thus also the first row defect register 54 and the second row defect register 56 are set to zero. Furthermore, all 4096 row lines are read in order into the sense amplifiers 2, the defect counter 38 is in each case set to zero and the rows are restored.

In step 220, a check is made to determine whether there is still a redundant row line RWL present. If so, the self-repair is enabled in step 230 and the address of the next redundant row line is stored in step 240 in the soft fuse register 62. If there is no longer a redundant row line present, the self-repair is inhibited in step 235. The next write or read access is then awaited in step 250.

If a write access to a row line takes place, then, in a step 260, before the storage of the memory cell contents of the row line, a signature of the regular bits 4 is calculated and stored in the signature bits 36. The row is then written to the associated memory cells by the sense amplifiers 2. The method then returns to step 250, where the next write/read access is again awaited.

If a read access to a row line 28 takes place, then a read initialization of the defect registers is carried out in step 270 (FIG. 4B). In this case, firstly the content of the first row defect register 54 is copied into the second row defect register 56. The content of the total row defect register 52 is then decreased by one. The defect counter 38 of the row line read is decreased by the content of the second row defect register 56, that is to say by the average number of defects of all of the row lines. If the defect counter 38 would thereby be set to a negative value, it is set to be equal to zero. Afterward, the total row defect register 52 is also decreased by the content of the second row defect register 56, but is set no lower than to zero.

The method subsequently continues with step 280, in which a signature is again calculated from the regular bits 4 of the row line 28 read. In step 290, this newly calculated signature is compared with the signature that was calculated during the last write access and stored in the signature bits 36. If the two signatures correspond, then the access to all of the memory cells is assessed as defect-free and the method returns to step 250, where it awaits the next write/read access.

If the two signatures do not correspond, then at least one memory cell content 24 of the row line 28 is defective. If a sufficient number of signature bits 36 were provided for the signature, then it is often possible to correct the defect in a step 300. By way of example, a memory cell array may have 4096+32 row lines and 512+32 column lines. There are then 32 column bits available, of which, for example, 5 bits can be used for the row defect counter and up to 27 bits can be used as signature bits.

In addition, the defect registers are updated in step 300. In particular, the total row defect register 52 and the defect counter 38 are increased by the content of the row defect register 56 and the total row defect register 52 is incremented by one. As a result, the steps carried out during the read initialization 270 are reversed again in the defect case. In addition, the defect counter 38 of the row line 28 and the total row defect register 52 are in each case increased by one. The overall result, then, is that in the defect case, the defect counter 38 of the respective row line and the total row defect register 52 are increased by 1, while in the case of a defect-free access to a row line, the defect counter 38 thereof and the total row defect register 52 are decreased by the average defect per row, but no further than down to zero.

In step 310, a check is then made to determine whether the row 28 that has been identified as defective is to be repaired. A repair is not intended to be effected for every defect, but rather only if the defect frequency of the row line 28 lies significantly above the average defect of all of the row lines WL. As a result, random or sporadically occurring defective read accesses, for example caused by the incidence of alpha rays, can be accepted, while hard defects which essentially occur during every access are reliably identified and eliminated.

In the exemplary embodiment, the repair condition that is provided is that the defect counter 38 of the present row line 28 assumes a value greater than or equal to 16 and the average defect—stored in the first row defect register 54—of all of the regular row lines is less than 8. Such a condition can be interrogated simply and through fast bit shifting operations, namely by interrogating whether the conditions defect counter 38 DIV 16>0 and first row defect register 54 DIV 8=0 are met. If both conditions are met at the same time, then the present row line has failed at least twice as often as the average of all the row lines and the present row line 28 is classified as permanently defective.

If the self-repair is enabled, step 320, the self-repair is initiated in step 330. To that end, firstly the row line stored in the soft fuse register 62 is opened and all accesses to the defective row line 28 are redirected to this redundant row line. The content of the present row line is copied into the redundant row line. Since the soft fuse register 62 is now in use, the self-repair option is temporarily inhibited in step 340.

The programming of the e-fuse 64 is then initiated in step 350, and this usually lasts for 1 µs to 1000 µs, for example 200 µs. However, the activation of the e-fuse 64 can proceed in the background, since accesses to the defective word line 28 are redirected via the soft fuse register 62 during the programming process. Consequently, there is no disturbance to current operation during the programming process either. Once the programming of the e-fuse 64 is concluded, the defective word line 28 is permanently replaced by a redundant defect-free word line, and the self-repair can be enabled again, provided that there are still redundant row lines RWL present.

When repair has been effected, the total number of defects stored in the total row defect register 52 is decreased by the number of defects of the defective row line 28, and the defect counter of the new row line is set to zero.

The method according to the invention thus utilizes the fast soft fuse register 62 for redirecting the row line addresses during the programming of the e-fuses 64, so that the memory module can continue to operate without disturbance during the programming. This avoids impairment of the utilization.

In another refinement of the integrated memory and of the method for testing and repairing said memory, it is possible to exchange not only defective rows but also defective columns for redundant rows and columns, respectively. To that end, for the case of a memory cell block having 4096×512 regular memory cells, the self-test unit 50 has, in addition to the registers described above, a total column defect register having a width of 13 bits and serving for accommodating the number of defects of all the regular columns, a first column defect register formed by the topmost 4 bits of the total column defect register, and a separate second column defect register for buffer-storage.

Moreover, 512 column defect counters are provided for accommodating the number of defects of each of the individual columns. With reference to FIG. 5A, in the method for testing and correcting row and column defects 400, firstly the defect registers are initialized in step 410 by all the defect registers being set to zero. In step 420, an interrogation is effected in respect of whether there are still redundant row lines present and, in accordance with the result of the interrogation, the row self-repair is enabled (step 430) or inhibited (step 435). Analogously, in step 440, a check is made to determine whether there are still redundant column lines present and, in accordance with the result, the column self-repair is enabled in step 450 or inhibited in step 455. In step 460, the routine then waits for the next write/read access.

In the case of a write access, in step 470, a new signature of the row line read is created and stored in an analogous manner to the previously described method.

In the event of a read access (FIG. 5B), a read initialization of the defect registers is carried out in step 480. In this case, the same operations are carried out for the row lines as described above in connection with step 270. For the column lines, firstly the content of the first column defect register is copied into the second column defect register and the content of the total column defect register is decreased by 512 (the number of columns). All 512 column defect counters are then decreased in each case by the content of the second column defect register, and the total column defect register is decreased by 512 times the content of the second column defect register. The lowest value to which all of the defect registers are set is zero.

Then, as described extensively above, a signature of the regular bits 4 read is calculated and, in step 490, compared with a previously stored signature. If the two signatures correspond, the access is deemed to be defect-free and the method returns to step 460 and waits for the next write/read access.

In the defect case, the method continues to step 500, where, if possible, a defect correction is carried out using the signature. Furthermore, it is attempted to determine from the signature that column line j, where j=0 . . . 511, in which the defect occurred. Afterward, the defect registers are updated, that is to say, for the defect registers, the actions performed during the read initialization are reversed and the defect counter 38 and the value of the total row defect register 52 is increased by one. Analogous actions are performed with the column registers, that is to say the total column defect register and the column defect counter of the column j are ultimately increased by one.

In step 510, an interrogation is then effected in respect of whether a repair is actually to take place, and, if so, whether the present row line or the column line identified as defective is to be replaced. To that end, firstly a check is made to determine whether the row self-repair and the column self-repair is actually enabled. Under the condition row defect counter DIV 16>0 and first row defect register 54 DIV 8=0, a row repair signal is then output. A column repair signal for the column line j is generated under the condition column defect counter j DIV 16>0 and first column defect register DIV 8=0.

Afterward, a check is also made to determine whether a row repair and/or a column repair is expedient. If only one repair signal is output, then either a column repair or row repair is to be performed, depending on the type of signal. If a so-called single cell fail is present, that is to say only one row and one column are affected, then the row repair is to be performed before the column repair until the row redundancy present has been used up. The single cell fails are then eliminated by means of column repair until this redundancy has also been used up.

In response to a row repair signal, in step 520, the row line is firstly redirected via the soft fuse register 62 and the e-fuse 64 is subsequently activated in step 530, as already described above.

If the column line identified as defective is to be replaced, a corresponding activation of an e-fuse is initiated in step 540. The repair of a column line is not possible in the background, since, for the copying of the defective column line, all 4096 word lines are interrogated and the bit corresponding to the defective column line has to be copied or calculated from the signature by ECC. Consequently, a simple copying of the defective line through a temporary redirection is insufficient here.

In this case, memory cell accesses are halted during the programming of the e-fuse. Once the programming of the e-fuse has been concluded, a bank refresh is carried out, in which, also in order, all of the row lines are read, the memory cell content of the column line j is reconstructed in step 550, using the stored signature 36 and this value is written to the corresponding location of the redundant column line.

After the conclusion of a row repair, the total row defect in the register 52 is decreased by the defect counter of the repaired row and the defect counter 38 of the repaired and now defect-free row line is set to zero. An analogous action takes place after the repair of a column line.

In a further refinement of the integrated memory, which can be used by itself or in association with one of the previously described embodiments, single cell defects are intended to be repaired. To that end, the integrated memory has, if appropriate in addition to the self-test unit 50, a self-test unit 150 (FIG. 3). The self-test unit 150 comprises a shift register 152 with 16 registers $152_0$ to $152_{15}$ which can each accommodate the complete address of a memory cell, namely the memory bank 154A, the row 154B and the column 154c. In addition, a five-bit counter 156 is provided, which is incremented by one when an address is stored in the shift register. At a predetermined value of the counter 156, the logic unit 158 carries out a check to determine whether an address has been repeatedly stored in the shift registers $152_0$ to $152_{15}$.

During operation, by way of example for each memory cell defect ascertained, the complete address of the defective memory cell is stored in the shift register 152 and the counter 156 is incremented by one. If the counter 156 has the value 16, that is to say if the shift register 152 has been filled, the logic unit 158 carries out XOR logic combination of the individual bits of the shift registers. If the same address has been stored sixteen times, the overall result is the value 0. This memory cell with this address is then identified as defective, even if the sixteen defective accesses are opposed by a higher number of defect-free accesses, which, however, do not lead to erasure of the stored addresses. Consequently, even those memory cells which do not have a hard defect, that is to say do not cause a defect signal for every individual access, can be characterized as defective.

If a memory cell 24 is identified as defective, the associated row line 28 and column line 26 is determined and either the row line 28 or the column line 26 is replaced by a redundant line. In this case, the row repair is performed before the column repair until the row redundancy present has been used up. The single cell defects are then eliminated by means of column repair until this redundancy has also been used up.

It goes without saying that the logic unit 158 can also perform a more complex evaluation of the addresses stored in the shift register 152. By way of example, if two memory cells exhibit occasional failures, two different addresses will appear in the register 152. The logic unit 158 can then determine, for example by means of a bubble location, the memory cell which has failed the most frequently and initiate a repair for that memory cell.

I claim:

1. An integrated memory, comprising:

a plurality of memory cells arranged in a memory cell block having a plurality of column lines and a plurality of row lines;

said plurality of row lines including regular row lines and redundant row lines;

a self-test unit connected to said memory cell block, said self-test unit:

upon a read access to a current row line, checking for a correctness of a memory cell content read in the read access and, upon detecting a defect, generating a defect signal for the current row line;

for each regular row line, detecting defects thus ascertained and performing a comparison comparing the defects with an average defect for said regular row lines; and outputting a row repair signal for the current row line when a predetermined repair condition is met in the comparison;

a self-repair unit connected to said self-test unit, said self-repair unit, in response to receiving the row repair signal, replacing the current row line by a redundant row line during an operation of the integrated memory.

2. The integrated memory according to claim 1, wherein:

said self-repair unit has a rewritable memory for rapidly redirecting an address of the current row line to an address of the redundant row line; and an irreversibly programmable memory for a permanent replacement of the current row line by the redundant row line.

3. The integrated memory according to claim 1, wherein said self-test unit is configured to check for the correctness of the read memory cell contents of the current row line using a comparison of a calculated signature of the memory cell contents with a stored signature of the memory cell contents.

4. The integrated memory according to claim 1, wherein:

said plurality of column lines includes regular column lines and redundant column lines;

said self-test unit:

upon a read access to a current row line, checks the correctness of the memory cell contents read and, in an event of a defect, generates a defect signal for the current row line;

in case of an ascertained defect, compares a calculated signature of the memory cell contents with a previously stored signature, for determining the column line in which the defect occurred;

for each regular row line and for each regular column line, detects the defects ascertained and in each case performs a comparison comparing the defects with an average defect for all of the regular row lines and all of the regular column lines; and when a predetermined repair condition is met during the comparison, outputs a row repair signal for the current row line or a column repair signal for a column line that has been identified as defective; and said self-repair unit:

in response to a row repair signal, replaces the current row line by a redundant row line during the operation of the integrated memory; and in response to a column repair signal, replaces the column line that has been identified as defective by a redundant column line.

5. The integrated memory according to claim 4, wherein said self-repair unit has an irreversible programmable memory for permanently replacing the column line identified as defective by the redundant column line; and a device for re-establishing the memory cell contents stored in the defective column line.

6. An integrated memory, comprising:

memory cells arranged in a memory cell block having a plurality of column lines and a plurality of row lines;

said plurality of row lines including regular row lines and redundant row lines, and said plurality of column lines including regular column lines and redundant column lines;

a self-test unit connected to said memory cell block and configured to:

in an event of a read access to a current row line, check a correctness of the memory cell contents read and, upon detecting a defect, generate a defect signal for the current row line;

in case of an ascertained defect, compare a calculated signature of the memory cell contents with a previously stored signature, for determining a respective column line in which the defect occurred;

store the complete addresses of the memory cells in which a defect occurred successively in a shift register;

if an address of a same memory cell is repeatedly stored in the shift register, determine the row line and column line associated with the memory cell; and when a predetermined repair condition is met, output a row repair signal for the associated row line or a column repair signal for the associated column line;

a self-repair unit connected to said self-test unit and configured to:

in response to a row repair signal, replace the current row line by a redundant row line during an operation of the integrated memory; and in response to a column repair signal, replace the column line that has been identified as defective by a redundant column line.

7. A method of testing and repairing an integrated memory having memory cells arranged in a memory cell block with a plurality of column lines and a plurality of row lines, and wherein the plurality of row lines includes regular row lines and redundant row lines, the method which comprises the following steps:

reading memory cell contents of a current row line;

checking a correctness of the memory cell contents read;

generating a defect signal for the current row line in a defect case;

detecting the defects ascertained for each regular row line;

comparing a number of defects of the current row line with an average defect for the regular row lines;

outputting a row repair signal for the current row line when a predetermined repair condition is met in the comparing step; and replacing the current row line by a redundant row line in response to a row repair signal during an operation of the integrated memory.

8. The method according to claim 7, which comprises:

during a writing of the memory cell contents of a current row line, calculating and storing a first signature of the memory cell contents;

during a reading of the row line, calculating a second signature of the memory cell contents; and comparing the first and second signatures to ascertain a correctness of the memory cell contents.

9. The method according to claim 7, which comprises increasing an average number of defects for all of the regular row lines in case of a defective read operation of a row line and decreasing the average number in case of a defect-free read operation.

10. The method according to claim 7, which comprises outputting a row repair signal if a number of defects of the current row line is twice as large as the average number of defects of all of the regular row lines.

11. The method according to claim 7, wherein the step of replacing the current row line comprises:

activating an irreversible programmable memory for the permanent replacement of the current row line by the redundant row line; and redirecting the address of the current row line to the redundant row line by way of a rewritable memory for as long as the activation of the irreversible programmable memory lasts.

12. A method of testing and repairing an integrated memory having memory cells arranged in a memory cell block with a plurality of column lines and a plurality of row lines, the plurality of row lines including regular row lines and redundant row lines and the plurality of column lines including regular column lines and redundant column lines, the method which comprises the following steps:

reading memory cell contents of a current row line;

checking a correctness of the memory cell contents read;

in a defect case, comparing a calculated signature of the memory cell contents with a previously stored signature for determining the column line in which the defect occurred;

in a defect case, generating a defect signal for the current row line and a column line determined as defective;

detecting the defects ascertained for each regular row line and each regular column line;

comparing a number of defects of the current row line with an average defect for the regular row lines, and comparing a number of defects of a column line determined as defective with an average defect for the regular column lines;

outputting a row repair signal for the current row line or a column repair signal for a column line identified as defective when a predetermined repair condition is met during the comparing steps; and replacing the current row line by a redundant row line in response to a row repair signal during an operation of the integrated memory, or replacing the column line identified as defective by a redundant column line in response to a column repair signal.

13. The method according to claim 12, which comprises:

during a writing of the memory cell contents of a current row line, calculating and storing a first signature of the memory cell contents;

during a reading of the row line, calculating a second signature of the memory cell contents; and comparing the first and second signatures to ascertain a correctness of the memory cell contents.

14. The method according to claim 12, which comprises increasing an average number of defects for all of the regular row lines in case of a defective read operation of a row line and decreasing the average number in case of a defect-free read operation.

15. The method according to claim 12, which comprises outputting a row repair signal if a number of defects of the current row line is twice as large as the average number of defects of all of the regular row lines.

16. The method according to claim 12, wherein the step of replacing the current row line comprises:

activating an irreversible programmable memory for the permanent replacement of the current row line by the redundant row line; and redirecting the address of the current row line to the redundant row line by way of a rewritable memory for as long as the activation of the irreversible programmable memory lasts.

17. A method of testing and repairing an integrated memory having memory cells arranged in a memory cell block with a plurality of column lines and a plurality of row lines, the plurality of row lines including regular row lines and redundant row lines and the plurality of column lines including regular column lines and redundant column lines, the method which comprises the following steps:

reading memory cell contents of a current row line;

checking a correctness of the memory cell contents;

in a defect case, comparing a calculated signature of the memory cell contents with a previously stored signature for determining the column line in which the defect occurred;

in the defect case, generating a defect signal for the current row line and a column line determined as defective;

storing the complete addresses of the memory cells in which a defect occurred;

testing for repeated storage of the address of the same memory cell;

upon reaching a predetermined number or frequency, determining the row line and column line associated with the memory cell;

outputting a row repair signal for the associated row line or a column repair signal for the associated column line when a predetermined repair condition is met; and replacing the current row line by a redundant row line in response to a row repair signal during an operation of the integrated memory, or replacing the column line identified as defective by a redundant column line in response to a column repair signal.

* * * * *